United States Patent
Uesugi et al.

(10) Patent No.: US 10,483,354 B2
(45) Date of Patent: Nov. 19, 2019

(54) NITRIDE SEMICONDUCTOR DEVICE

(71) Applicant: Kabushiki Kaisha Toshiba, Minato-ku (JP)

(72) Inventors: Kenjiro Uesugi, Kawasaki (JP); Shigeya Kimura, Yokohama (JP); Toshiki Hikosaka, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/118,573

(22) Filed: Aug. 31, 2018

(65) Prior Publication Data

US 2019/0237550 A1 Aug. 1, 2019

(30) Foreign Application Priority Data

Jan. 30, 2018 (JP) ................. 2018-013976

(51) Int. Cl.
| | |
|---|---|
| H01L 29/20 | (2006.01) |
| H01L 29/778 | (2006.01) |
| H01L 29/417 | (2006.01) |
| H01L 29/207 | (2006.01) |
| H01L 29/423 | (2006.01) |
| H01L 29/205 | (2006.01) |

(52) U.S. Cl.
CPC ........ *H01L 29/2003* (2013.01); *H01L 29/205* (2013.01); *H01L 29/207* (2013.01); *H01L 29/41725* (2013.01); *H01L 29/4232* (2013.01); *H01L 29/7783* (2013.01)

(58) Field of Classification Search
CPC .......................... H01L 29/2003; H01L 29/205
See application file for complete search history.

(56) References Cited

U.S. PATENT DOCUMENTS

| | | | |
|---|---|---|---|
| 2001/0020700 A1* | 9/2001 | Inoue | H01L 29/205 257/20 |
| 2009/0045438 A1 | 2/2009 | Inoue et al. | |
| 2012/0273795 A1 | 11/2012 | Li | |
| 2014/0175456 A1 | 6/2014 | Kuraguchi | |
| 2016/0260827 A1 | 9/2016 | Nishimori et al. | |

(Continued)

FOREIGN PATENT DOCUMENTS

| | | |
|---|---|---|
| JP | 2001-196575 | 7/2001 |
| JP | 2008-103617 | 5/2008 |
| JP | 2012-231003 | 11/2012 |

(Continued)

*Primary Examiner* — Mounir S Amer
(74) *Attorney, Agent, or Firm* — Oblon, McClelland, Maier & Neustadt, L.L.P.

(57) ABSTRACT

In one embodiment, a nitride semiconductor device is provided with a first semiconductor layer that is a layer of $Al_{x1}Ga_{(1-x1)}N$ ($0<x1\leq1$), a second semiconductor layer that is on the first semiconductor layer and is a layer of a nitride semiconductor $In_{y2}Al_{x2}Ga_{(1-x2-y2)}N$ ($0<x2<1$, $0<y2<1$, $0<x2+y2\leq1$) containing indium, a third semiconductor layer that is on the second semiconductor layer and is a layer of $Al_{x3}Ga_{(1-x3)}N$ ($0\leq x3<1$), and a fourth semiconductor layer that is on the third semiconductor layer and is an layer of $In_{y4}Al_{x4}Ga_{(1-x4-y4)}N$ ($0<x4<1$, $0\leq y4<1$, $0<x4+y4\leq1$).

15 Claims, 4 Drawing Sheets

(56) References Cited

U.S. PATENT DOCUMENTS

2018/0145163 A1* 5/2018 Teo .................. H01L 29/06

FOREIGN PATENT DOCUMENTS

| JP | 5098649 | 12/2012 |
| JP | 5466505 | 4/2014 |
| JP | 2015-162641 | 9/2015 |
| JP | 2016-35949 | 3/2016 |
| JP | 2016-163017 | 9/2016 |

* cited by examiner

NITRIDE SEMICONDUCTOR DEVICE

CROSS-REFERENCE TO RELATED APPLICATION

This application is based upon and claims the benefit of priority from the prior Japanese Patent Application No. 2018-013976, filed on Jan. 30, 2018, the entire contents of which are incorporated herein by reference.

FIELD

Embodiments described herein relate generally to a nitride semiconductor device.

BACKGROUND

In a transistor using a nitride semiconductor, high withstand characteristics are obtained, due to electrical material characteristics of the nitride semiconductor that is a material with a wide band gap, and such a transistor becomes a semiconductor device that replaces a power device using silicon. A nitride semiconductor has polarization resulting from symmetry of the crystal structure thereof, and it is known that a two-dimensional electron gas may be generated at a lamination interface of nitride semiconductor layers with different compositions of constituent elements. Since the two-dimensional electron gas has a high electron mobility, a transistor using the two-dimensional electron gas as a channel can electrically perform a high speed response, and when the transistor is used as a high speed switching device, a high energy conversion efficiency is obtained. The transistor using the nitride semiconductor like this has a high breakdown voltage and high speed responsiveness, and thereby it is expected that the transistor like this is used for a power conversion device such as a power source.

In the laminated structure of the nitride semiconductors, the two-dimensional electron gas generated by polarization is accumulated even in the state in which an external electric field is not applied, and thereby in the transistor using the two-dimensional electron gas as the channel, a threshold voltage thereof becomes a negative voltage. But a transistor with the threshold voltage of a positive value is desired from the viewpoint of improving safety, reducing power consumption, and simplifying constitution circuits. As a technology to raise the threshold voltage, a technology is known in which a concave shape groove is formed in a device only at a portion below a gate electrode so that the two-dimensional electron gas is not generated therein. In addition, a technology is known in which a channel layer is laminated on a back barrier layer to improve the threshold voltage.

For example, when a gallium nitride (GaN) layer is used as the channel layer and an aluminum gallium nitride (AlGaN) layer is used as the back barrier layer, the higher a composition of aluminum (Al) contained in the back barrier layer is, the more the threshold voltage can be improved.

However, when an Al composition of the back barrier layer is made higher, a lattice mismatch rate between the back barrier layer and the channel layer becomes higher. Accordingly, when the channel layer is laminated on the back barrier layer, crystal defect is easy to be introduced into the channel layer, and thereby crystal quality of the channel layer deteriorates.

Specifically, surface flatness of the channel layer falls and the thickness of the channel layer becomes nonuniform. In addition, crystal defect such as threading dislocations is increased in the channel layer. When the crystal quality of the channel layer deteriorates, the electron mobility in the channel layer is decreased, and thereby an ON resistance of the transistor is increased to increase power consumption. Accordingly, a nitride semiconductor device capable of improving the crystal quality of the channel layer and improving the threshold voltage is desired.

DETAILED DESCRIPTION

According to one embodiment, a nitride semiconductor device is provided with a first semiconductor layer that is a layer of $Al_{x1}Ga_{(1-x1)}N$ ($0<x1\le1$), a second semiconductor layer that is on the first semiconductor layer and is a layer of a nitride semiconductor $In_{y2}Al_{x2}Ga_{(1-x2-y2)}N$ ($0<x2<1$, $0<y2<1$, $0<x2+y2\le1$) containing indium, a third semiconductor layer that is on the second semiconductor layer and is a layer of $Al_{x3}Ga_{(1-x3)}N$ ($0\le x3<1$), and a fourth semiconductor layer that is on the third semiconductor layer and is an layer of $In_{y4}Al_{x4}Ga_{(1-x4-y4)}N$ ($0<x4<1$, $0\le y4<1$, $0<x4+y4\le1$).

Hereinafter, embodiments of the present invention will be described with reference to the drawings. Ones with the same symbols show the similar ones. In addition, the drawings are schematic or conceptual, and accordingly, the relation between a thickness and a width of each portion, and a ratio coefficient of sizes between portions are not necessarily identical to those of the actual ones. In addition, even when the same portions are shown, the dimensions and the ratio coefficient thereof may be shown different depending on the drawings.

In the present specification, in order to indicate the position relation of components and so on, an upward direction in the drawing is stated as "up or upward", and a downward direction in the drawing is stated as "down or downward". In the present specification, the concepts of "up or upward" and "down or downward" are not necessarily terms indicating the relation with the direction of the gravity.

In the present specification, "a gallium nitride based semiconductor" is a general term of gallium nitride (GaN), aluminum nitride (AlN), indium nitride (InN), and a semiconductor containing an intermediate composition thereof.

In the present specification, "a group III atom" is a general term of boron (B), aluminum (Al), gallium (Ga), indium (In), and thallium (Tl).

Since a transistor using a nitride semiconductor has a low threshold voltage, a gallium nitride (GaN) layer to become a channel layer is laminated on an aluminum gallium nitride (AlGaN) layer that is a back barrier layer to improve the threshold voltage. In this case, the higher a composition of aluminum (Al) contained in AlGaN of the back barrier layer is, the more the threshold voltage of the transistor can be improved.

However, when the composition of Al of AlGaN is made higher, a lattice mismatch rate between AlGaN and GaN becomes larger, and thereby the GaN layer cannot be uniformly formed. Accordingly, a nitride semiconductor device capable of uniformly forming the GaN layer to improve the crystal quality and improving the threshold voltage is desired.

Figure 1:
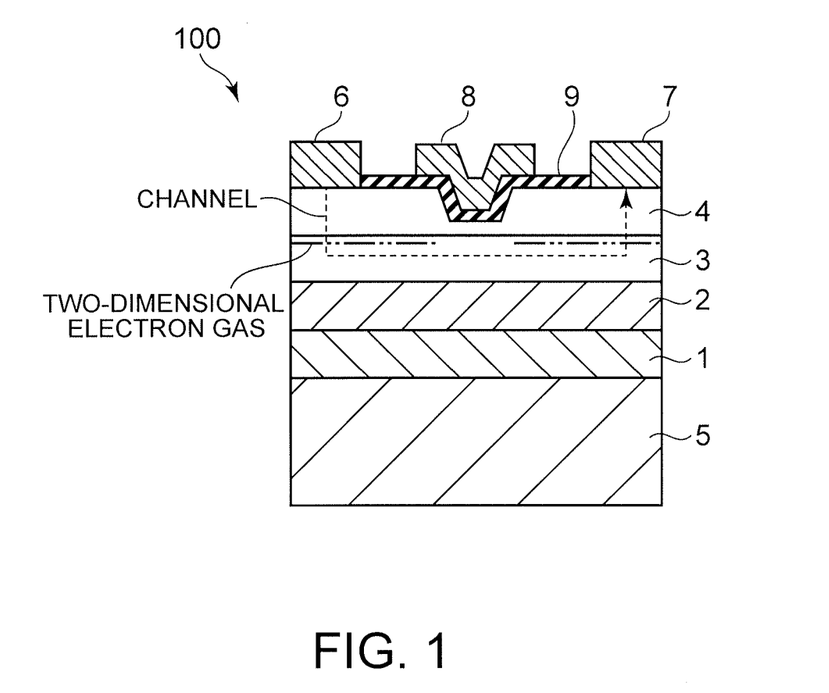
FIG. 1 is a schematic sectional view of a nitride semiconductor device of an embodiment.

FIG. 1 shows a schematic sectional view for describing a nitride semiconductor device 100 of the present embodiment.

The nitride semiconductor device 100 is a field effect transistor (Field Effect Transistor: FET) composed of a GaN based semiconductor.

The nitride semiconductor device 100 is provided with a semiconductor layer in which a first semiconductor layer 1, a second semiconductor layer 2, a third semiconductor layer 3, and a fourth semiconductor layer 4 are laminated in this order on a substrate 5. In addition, a source electrode 6 and a drain electrode 7 are provided on the fourth semiconductor layer 4. In addition, an insulating layer 9 is provided on the fourth semiconductor layer 4 between the source electrode 6 and the drain electrode 7, and further a gate electrode 8 is provided on the insulating layer 9.

The nitride semiconductor device 100 is provided with the second semiconductor layer 2 that is a back barrier layer in the form of an indium gallium aluminum (InAlGaN) layer, and the third semiconductor layer 3 that is a channel layer in the form of a GaN layer. Generally, the a-axis lattice constant of AlGaN is smaller than the a-axis lattice constant of GaN, and the a-axis lattice constant of InGaN is larger than the a-axis lattice constant of GaN. The a-axis lattice constant of InAlGaN in which a part of Ga in AlGaN is replaced by In is larger than the a-axis lattice constant of AlGaN, and the higher the ratio of In to Ga is, the larger the a-axis lattice constant thereof becomes. When the a-axis lattice constants of AlGaN and InAlGaN with the same Al composition are compared, within the range in which the a-axis lattice constant of InAlGaN does not exceed the a-axis lattice constant of GaN, the a-axis lattice constant of InAlGaN is more approximate to the a-axis lattice constant of GaN. Accordingly, the lattice mismatch rate of the InAlGaN layer that is the back barrier layer and the GaN layer that is the channel layer is small. Accordingly, it is possible to uniformly form the GaN layer of the channel layer on the InAlGaN layer of the back barrier layer. And the composition of Al of InAlGaN of the back barrier layer is increased, and thereby a threshold voltage of the nitride semiconductor device 100 can be improved.

The substrate 5 is made of silicon (Si), silicon carbide (SiC), sapphire ($Al_2O_3$), gallium nitride (GaN), aluminum nitride (AlN), gallium oxide ($Ga_2O_3$) or the like, for example. The semiconductor layer described later is laminated on the substrate 5, and thereby the substrate 5 fixes the semiconductor layer. A thickness of the substrate 5 is not less than 200 μm and not more than 2000 μm, for example.

The first semiconductor layer 1 is provided on the substrate 5. The first semiconductor layer is an aluminum gallium nitride ($Al_{x1}Ga_{(1-x1)}N$, $0<x1\leq1$) layer.

In addition, x1 is an atom ratio of Al that is a ratio of Al atoms to the total group III atoms contained in the first semiconductor layer 1.

The first semiconductor layer 1 is a buffer layer. Hereinafter, aluminum gallium nitride is written as AlGaN. The first semiconductor layer 1 may be a layer in which a plurality of semiconductor layers having mutually different compositions of Al and Ga within the range of ($Al_{x1}Ga_{(1-x1)}N$, $0<x1\leq1$) are laminated, and further a layer is quoted in which as the semiconductor layers are laminated more upward from the substrate 5 side, for example, Al contents of the respective semiconductor layers are made smaller. In this case, in the first semiconductor layer 1, as the semiconductor layers are laminated more upward from the substrate 5 side, the polarization thereof becomes smaller. In addition, in the first semiconductor layer 1, as the semiconductor layers are laminated more upward from the substrate 5 side, the a-axis lattice constants thereof become larger. A thickness of the first semiconductor layer 1 is not less than 10 nm and not more than 10 μm, for example.

The first semiconductor layer 1 may contain impurities so as to make a current difficult to flow and improve a breakdown voltage. An impurity for the first semiconductor layer 1, C (carbon), Fe (iron), Mg (magnesium), Zn (zinc) or the like is quoted. An impurity concentration of the first semiconductor layer 1 is preferably not less than $1\times10^{16}$ cm$^{-3}$ and not more than $1\times10^{20}$ cm$^{-3}$. In addition, the first semiconductor layer 1 may contain different impurities. The first semiconductor layer 1 may contain impurities such as H (hydrogen), O (oxygen), Si (silicon), and so on which have unintentionally been contained therein. The second semiconductor layer 2 is provided on the first semiconductor layer 1. The second semiconductor layer 2 is an indium aluminum gallium nitride ($In_{y2}Al_{x2}Ga_{(1-x2-y2)}N$, $0<x2<1$, $0<y2<1$, $0<x2+Y2\leq1$) layer, for example. In addition, x2 is an atom ratio of Al to the total group III atoms contained in the second semiconductor layer 2. And y2 is an atom ratio of In to the total group III atoms contained in the second semiconductor layer 2.

The second semiconductor layer 2 is the back barrier layer. Hereinafter, indium aluminum gallium nitride is written as InAlGaN. A thickness of the second semiconductor layer 2 is not less than 10 nm and not more than 1 μm, for example.

The second semiconductor layer 2 preferably contains impurities so as to make the current difficult to flow and improve the breakdown voltage. An impurity for the second semiconductor layer 2, C (carbon), Fe (iron), Mg (magnesium), Zn (zinc), or the like is quoted. An impurity concentration of the second semiconductor layer 2 is preferably not less than $1\times10^{16}$ cm$^{-3}$ and not more than $1\times10^{20}$ cm$^{-3}$. In addition, the second semiconductor layer 2 may contain different impurities. In addition, the second semiconductor layer 2 may contain impurities such as H (hydrogen), (oxygen), Si (silicon), and so on which have unintentionally been contained therein.

As the composition of Al contained in InAlGaN of the second semiconductor layer 2 is larger, so an effect of improving the threshold voltage is larger. For the reason, x2 indicating the composition of Al is preferably not less than 0.1. More preferably, x2 is not less than 0.15, for the effect for improving the threshold voltage.

In addition, when In is added to the second semiconductor layer 2, the a-axis lattice constant of the second semiconductor layer 2 is approximated to that of the third semiconductor layer 3 of the channel layer described later, and thereby the lattice mismatch rate with the third semiconductor layer 3 can be decreased. y2 indicating the composition of In may exceed 0, but particularly, y2 is preferably not less than 0.01 and not more than 0.1. y2 indicating the composition of In is more preferably not less than 0.02 and not more than 0.05, for improving the crystal quality of the second semiconductor layer 2.

The third semiconductor layer 3 is provided on the second semiconductor layer 2. The third semiconductor layer 3 is an aluminum gallium nitride ($Al_{x3}Ga_{(1-x3)}N$, $0\leq x3<1$) layer, for example. In addition, x3 is an atom ratio of Al to the total group III atoms contained in the third semiconductor layer 3.

The third semiconductor layer 3 is the channel layer. In order to increase the effect of improving the threshold voltage by the second semiconductor layer 2 that is the back barrier layer, to suppress an On resistance, and to improve a channel mobility, a thickness of the third semiconductor layer 3 is preferably not less than 10 nm and not more than 200 nm, for example. More preferably, the thickness thereof is not less than 20 nm and not more than 100 nm.

The third semiconductor layer 3 is an undoped layer. The third semiconductor layer 3 may not be intentionally doped with impurities, and in this case, the third semiconductor layer 3 exhibits weak n-type conductivity. In addition, the third semiconductor layer 3 may contain impurities such as H (hydrogen), O (oxygen), Si (silicon), and so on which have unintentionally been contained therein.

The fourth semiconductor layer 4 is provided on the third semiconductor layer 3. The fourth semiconductor layer 4 is an indium aluminum gallium nitride ($In_{y4}Al_{x4}Ga_{(1-x4-y4)}N$, $0<x4<1$, $0\leq y4<1$, $0<x4+y4\leq 1$) layer, for example. In addition, x4 is an atom ratio of Al to the total group III atoms contained in the fourth semiconductor layer 4. And y4 is an atom ratio of In to the total group In atoms contained in the fourth semiconductor layer 4.

The fourth semiconductor layer 4 is an electron supply layer. The fourth semiconductor layer 4 is an undoped layer. The fourth semiconductor layer 4 may not be intentionally doped with impurities, and in this case, the fourth semiconductor layer 4 exhibits weak n-type conductivity. In addition, the fourth semiconductor layer 4 may contain impurities such as H (hydrogen), (oxygen), Si (silicon), and so on which have unintentionally been contained therein.

A thickness of the fourth semiconductor layer 4 is not less than 20 nm and not more than 100 nm, for example. The gate electrode 8 described later is embedded into a part of the fourth semiconductor layer 4 via the insulating layer 9. For the reason, a thickness of the fourth semiconductor layer 4 below the gate electrode 8 is not less than 0 nm and not more than 5 nm, for example.

In addition, the In compositions and the Al compositions may be different in the portion below the gate electrode 8 and in the other portion in the fourth semiconductor layer 4. For example, the Al composition may be smaller or the In composition may be larger in the portion below the gate electrode 8 than in the other portion. In addition, the fourth semiconductor layer 4 may have a structure in which a plurality of InAlGaN layers having different In compositions and Al compositions have been laminated.

In order that two-dimensional electron gas is not generated in the third semiconductor layer 3 adjacent to the fourth semiconductor layer 4 below the gate electrode 8, the composition x4 of Al is preferably made to be an atom ratio of Al of not more than 0.2 to the total group III atoms contained in the fourth semiconductor layer 4. In addition, a thickness of the fourth semiconductor layer 4 below the gate electrode 8 is preferably made to be not less than 0 nm and not more than 5 nm.

In order that two-dimensional electron gas is generated in the third semiconductor layer 3 adjacent to the fourth semiconductor layer 4 except the portion below the gate electrode 8, and the ON resistance is decreased, the composition x4 of Al is preferably made to be not less than 0.15 to the total group III atoms contained in the fourth semiconductor layer 4. In addition, a thickness of the fourth semiconductor layer 4 except the portion below the gate electrode 8 is made to be not less than 20 nm and not more than 100 nm.

In the fourth semiconductor layer 4, the composition of Al of the portion except the portion below the gate electrode 8 may be made larger than the composition of Al of the portion below the gate electrode 8. By this means, in the fourth semiconductor layer 4, even when the composition x4 of Al is an atom ratio of not more than 0.2 to the total group III atoms contained in the fourth semiconductor layer 4, it is possible to generate the two-dimensional electron gas of a high density in the third semiconductor layer 3 at the portion except the portion below the gate electrode 8. By this means, it is possible to achieve both the high threshold voltage and the low ON resistance.

The insulating layer 9 is provided on the fourth semiconductor layer 4. The insulating layer 9 is made of silicon oxide, silicon nitride, silicon oxynitride, gallium oxide, aluminum oxide, aluminum oxynitride, hafnium oxide, or the like, for example. In addition, the insulating layer 9 may have a structure in which two or more materials different from each other consisting of these insulators are laminated in a plurality of layers. A thickness of the insulating layer 9 is not less than 5 nm and not more than 100 nm, for example.

The source electrode 6 and the drain electrode 7 are provided on the fourth semiconductor layer 4. The source electrode 6 and the drain electrode 7 are each a metal electrode, for example. The metal electrode has a laminated structure of titanium (Ti) and aluminum (Al), for example. In addition, the source electrode 6 and the drain electrode 7 may be provided on the surface of the fourth semiconductor layer 4 a part of which has been etched. In addition, a part of the fourth semiconductor layer 4 is etched to expose the third semiconductor layer 3, and then the source electrode 6 and the drain electrode 7 may be provided on the exposed surface of the third semiconductor layer 3.

The gate electrode 8 is between the source electrode 6 and the drain electrode 7 and is provided on the insulating layer 9. The gate electrode 8 is a metal electrode, for example. The gate electrode 8 contains at least one selected from the group consisting of aluminum (Al), titanium (Ti), nickel (Ni), gold (An), titanium nitride (TiN), and tungsten nitride (WN), for example. A part of the gate electrode 8 is embedded in the fourth semiconductor layer 4 via the insulating layer 9.

A two-dimensional electron gas layer is formed in the third semiconductor layer 3 in the vicinity of the interface between the third semiconductor layer and the fourth semiconductor layer 4. A dashed-two dotted line of FIG. 1 indicates a position where the two-dimensional electron gas exists. At the portion of the fourth semiconductor layer 4 below the gate electrode 8, the fourth semiconductor layer 4 is thin and the composition of Al is small, and accordingly, the two-dimensional electron gas does not exist in the third semiconductor layer 3 adjacent to this portion. Accordingly, the nitride semiconductor device 100 is normally off, in the state in which a voltage is not applied to the gate electrode 8.

When a positive voltage is applied to the gate electrode 8, the third semiconductor layer 3 at the gate electrode 8 side becomes a storage state in which electrons are to be induced. For the reason, the electrons induced in the storage state and the two-dimensional electron gas layer existing at the interface between the third semiconductor layer 3 and the fourth semiconductor layer 4 couple to each other. Accordingly, a current flows in the direction of an arrow shown by a dotted line of FIG. 1. Thereby the nitride semiconductor device 100 operates as an FET.

A voltage to be applied to the gate electrode 8 when the two-dimensional electron gas flows is determined by a work function of the metal composing the gate electrode 8, a dielectric constant of the insulating layer 9, a thickness of the insulating layer 9, an In composition and an Al composition and a thickness of the portion of the fourth semiconductor layer 4 below the electrode 8, concentrations of donors and acceptors contained in the third semiconductor layer 3, and a surface potential of the third semiconductor layer 3.

In addition, amounts of Al contained in the respective semiconductor layers are made smaller in the laminating direction, in the order of the first semiconductor layer 1, the second semiconductor layer 2, and the third semiconductor layer 3. For the reason, the polarizations become smaller in the order of the first semiconductor layer 1, the second semiconductor layer 2, and the third semiconductor layer 3, and accordingly, the two-dimensional electron gas is not unintentionally generated between the first semiconductor layer 1 and the second semiconductor layer 2, and between the second semiconductor layer 2 and the third semiconductor layer 3.

In addition, since the amounts of Al contained in the respective semiconductor layers are smaller in the laminating direction, in the order of the first semiconductor layer 1, the second semiconductor layer 2, and the third semiconductor layer 3, the a-axis lattice constants are larger in this order. For the reason, during the crystal growth of the semiconductor layers and after the crystal growth thereof, stress to be pulled in the in-plane direction which the semiconductor layer receives from the layer just below the relevant semiconductor layer is suppressed, and generation of cracks in the semiconductor layers can effectively be suppressed.

In addition, the first semiconductor layer 1 to the fourth semiconductor layer 4 are formed by a metalorganic chemical vapor deposition (MOCVD) method, for example.

In crystal growth by an MOCVD method, as a raw material for a Ga atom, trimethyl gallium (TMGa) and triethyl gallium (TEGa), for example, as a raw material for an Al atom, trimethyl aluminum (TMAl), for example, as a raw material for an In atom, trimethyl indium (TMIn) and triethyl indium (TEIn), for example, and as a raw material for an N atom, ammonia ($NH_3$), for example, can be used. In addition, in the crystal growth by the MOCVD method, any of hydrogen, nitrogen and argon or a mixed gas of these is simultaneously supplied as a carrier gas, in addition to the above-described raw material. A ratio of the raw materials to be supplied at the time of crystal growth is changed, and thereby the composition of the semiconductor layer to be grown can be changed.

Figure 2A:
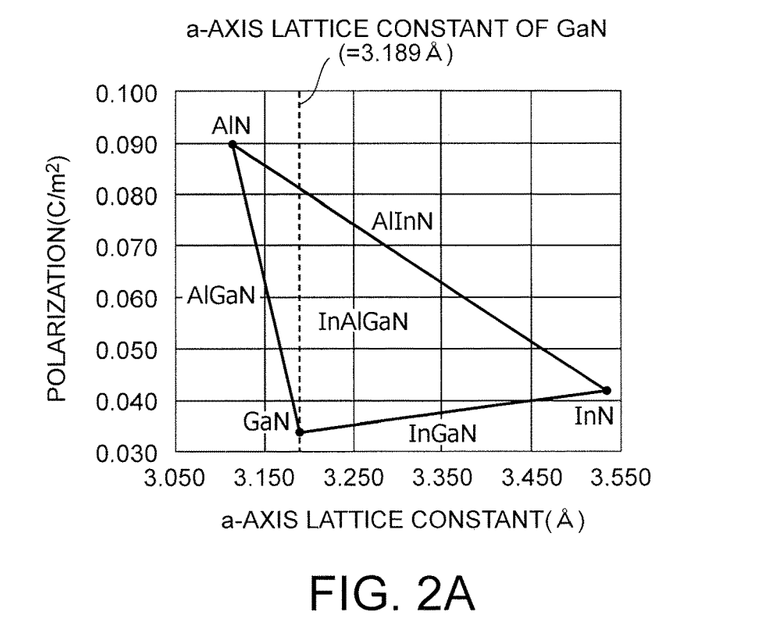
FIG. 2A is a diagram showing relationships between a polarization and an a-axis lattice constant of nitride semiconductors.
Figure 2B:
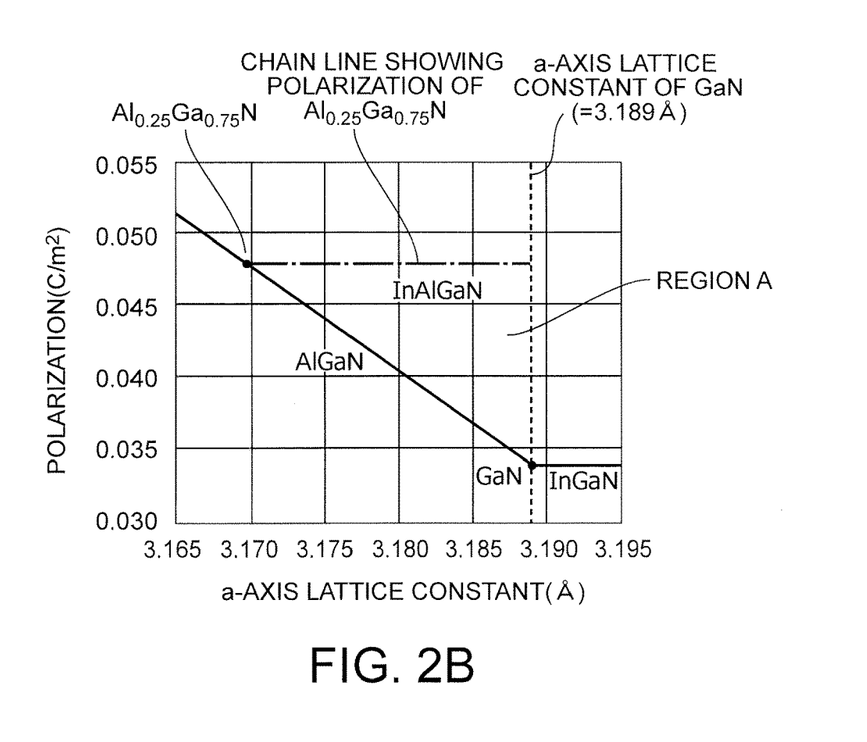
FIG. 2B is a diagram showing relationships between a polarization and an a-axis lattice constant of nitride semiconductors.

FIG. 2A shows a diagram indicating relationships between a polarization ($C/m^2$) and an a-axis lattice constant (Å) of nitride semiconductors, and FIG. 2B shows an enlarged diagram of FIG. 2A. The relationship between a polarization and an a-axis lattice constant of the second semiconductor layer 2 that is the back barrier layer is shown using FIG. 2A and FIG. 2B. Here, the polarization ($C/m^2$) of the nitride semiconductor is a sum of a spontaneous polarization and a piezoelectric polarization.

In FIG. 2A, the relationships between a polarization and an a-axis lattice constant of aluminum nitride (AlN), indium nitride (InN), and gallium nitride (GaN) are respectively shown by three points. In addition, a straight line between two points indicating AlN and InN shows the relationship between a polarization and an a-axis lattice constant of aluminum indium nitride (AlInN). A straight line between two points indicating InN and GaN shows the relationship between a polarization and an a-axis lattice constant of indium gallium nitride (InGaN). A straight line between two points indicating GaN and AlN shows the relationship between a polarization and an a-axis lattice constant of aluminum gallium nitride (AlGaN). In addition, a region surrounded by the three straight lines shows the relationship between a polarization and an a-axis lattice constant of indium gallium aluminum nitride (InAlGaN). In addition, a broken line is shown at a position of 3.189 Å that is the a-axis lattice constant of GaN. 3.189 Å that is the a-axis lattice constant of GaN is a physical property value when there is no distortion in the crystal lattice of GaN.

From FIG. 2A, it is found that In is added to AlGaN and thereby InAlGaN can be obtained, for example. In addition, AlGaN is made to be InAlGaN, and thereby it is possible to approximate the a-axis lattice constant thereof to GaN (=3.189 Å). Accordingly, when the second semiconductor layer 2 that is the back barrier layer of the nitride semiconductor device 100 is made to be the InAlGaN layer, the lattice mismatch rate between the second semiconductor layer 2 and the third semiconductor layer 3 that is the GaN layer of the channel layer is small.

FIG. 2B shows a diagram in which the vicinity of the point showing GaN of FIG. 2A is enlarged. FIG. 2B shows the relationship between a polarization and an a-axis lattice constant of the second semiconductor layer 2 that is the back barrier layer.

A region A in FIG. 2B which is surrounded by the straight line indicating AlGaN, a chain line indicating a polarization of a composition $Al_{0.25}Ga_{0.75}N$, and the broken line indicating the a-axis lattice constant of GaN is noticed. In order that the third semiconductor layer 3 that is the channel layer is uniformly formed and has high quality, the composition of the second semiconductor layer 2 is made to be a composition whose relationship between a polarization and an a-axis lattice constant is included in the region A.

To begin with, a point of the composition $Al_{0.25}Ga_{0.75}N$ is shown on the straight line indicating AlGaN. This is the composition of the first semiconductor layer 1 in the vicinity of the interface between the first semiconductor layer 1 and the second semiconductor layer 2. An a-axis lattice constant and a polarization of InAlGaN can be adjusted by amounts of Al and In contained in InAlGaN. As an amount of Al contained in InAlGaN is made smaller, or as an amount of In contained in InAlGaN is made larger, so an a-axis lattice constant of InAlGaN becomes larger. In addition, as an amount of Al contained in InAlGaN is made larger, so a polarization of InAlGaN becomes larger. In addition, when an amount of In is made lager, whether a polarization becomes larger or smaller is determined by a lattice relaxation rate described later of InAlGaN.

Hereinafter, conditions for uniformly forming the third semiconductor layer 3 that is the channel layer and making it to have high quality will be described.

To begin with, an a-axis lattice constant of the second semiconductor layer 2 that is the back barrier layer is made equal to the a-axis lattice constant of GaN shown by the broken line of FIG. 2B, or made smaller than the a-axis lattice constant of GaN. When the a-axis lattice constant of the second semiconductor layer 2 is larger than the a-axis lattice constant of GaN, the third semiconductor layer 3 that is the channel layer receives a tensile stress from the second semiconductor layer 2 that is the back barrier layer. For the reason, the third semiconductor layer 3 that is the channel layer is not uniformly formed and the crystal quality might deteriorate. Further, there is a possibility that two-dimensional electron gas might be generated at the interface between the third semiconductor layer 3 and the second semiconductor layer 2.

A polarization of the second semiconductor layer 2 that is the back barrier layer is made equal to a polarization of the first semiconductor layer 1 in the vicinity of the interface between the first semiconductor layer 1 that is the buffer layer and the second semiconductor layer 2, or is made smaller than it. When the polarization of the second semiconductor layer 2 that is the back barrier layer is larger than the polarization of the first semiconductor layer 1 that is the buffer layer, there is a possibility that two-dimensional electron gas might be generated at the interface between the second semiconductor layer 2 and the first semiconductor layer 1.

Further, a composition of In in the second semiconductor layer 2 that is the back barrier layer is made larger than 0. In is contained in the second semiconductor layer 2, and thereby the a-axis lattice constant of the second semiconductor layer 2 can be made larger than AlGaN. In addition, since In is contained in the second semiconductor layer 2, even when the a-axis lattice constant of the second semiconductor layer 2 is equal to the a-axis lattice constant of AlGaN, the polarization of the second semiconductor layer 2 can be made larger than AlGaN. In addition, since In is contained in the second semiconductor layer 2, even when the polarization of the second semiconductor layer 2 is equal to the polarization of AlGaN, the a-axis lattice constant of the second semiconductor layer 2 can be made larger than AlGaN.

Figure 3A:
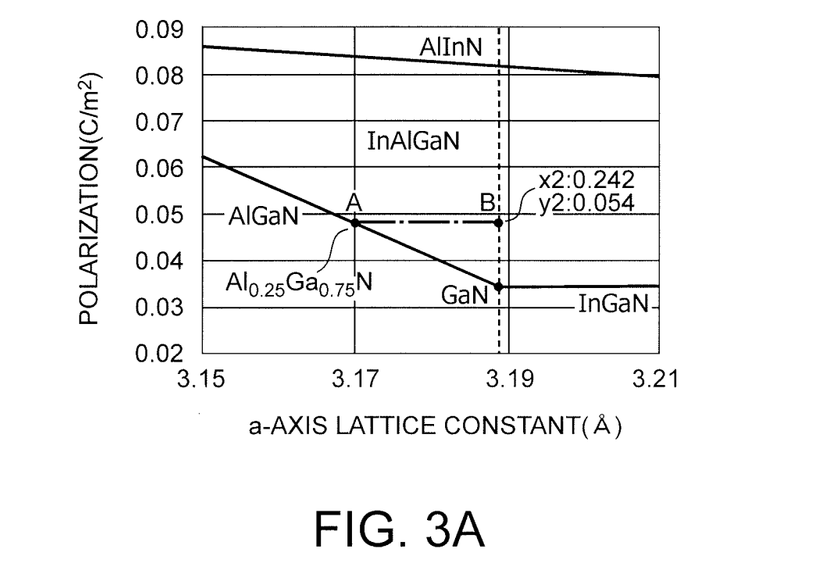
FIGS. 3A-3C are diagrams each showing relationships between a polarization and an a-axis lattice constant of nitride semiconductors.
Figure 3B:
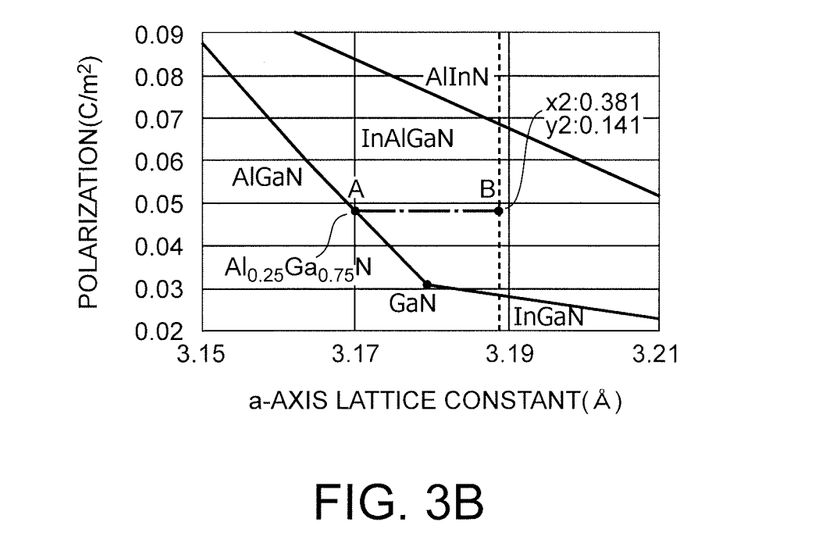
Figure 3C:
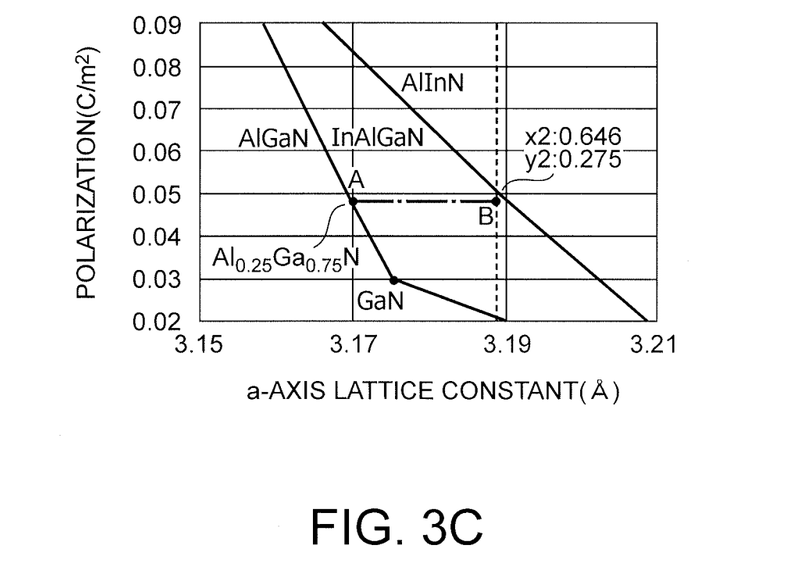

FIG. 3A to FIG. 3C show relationships between a polarization and an a-axis lattice constant of the second semiconductor layers 2 having different lattice relaxation rates. Regarding the lattice relaxation rates of the second semiconductor layers 2, FIG. 3A shows a case in which the lattice relaxation rate is 100%, FIG. 3B shows a case in which the lattice relaxation rate is 50%, and FIG. 3C shows a case in which the lattice relaxation rate is 30%.

The second semiconductor layer 2 that is the InAlGaN layer has a larger a-axis lattice constant than the first semiconductor layer 1 that is the AlGaN layer, and accordingly, the second semiconductor layer 2 receives a compressive stress from the first semiconductor layer 1. That is, the second semiconductor layer 2 crystal-grows so as to match the a-axis lattice constant of the first semiconductor layer 1, and accordingly the second semiconductor layer 2 is distorted. The compressive stress of the second semiconductor layer 2 changes depending on a lattice relaxation rate. The smaller the lattice relaxation rate of the second semiconductor layer 2 is, the larger the compressive stress which the second semiconductor layer 2 receives becomes, and the larger the lattice relaxation rate of the second semiconductor layer 2 is, the smaller the compressive stress which the second semiconductor layer 2 receives becomes.

Since a magnitude of the piezo polarization of the second semiconductor layer 2 changes depending on an amount of the compressive stress which the second semiconductor layer 2 receives, a size of the polarization to be generated in the second semiconductor layer 2 also changes. That is, the larger a compressive stress which the second semiconductor layer 2 receives, the larger a polarization to be generated in the second semiconductor layer 2 becomes. For the reason, when the lattice relaxation rate of the second semiconductor layer 2 changes, in order that the third semiconductor layer 3 that is the channel layer is uniformly formed and is made to have high quality, values which the composition x1 of Al of the first semiconductor layer 1, the composition x2 of Al of the second semiconductor layer 2, and the composition y2 of In of the second semiconductor layer 2 can obtain have been calculated.

In the case of FIG. 3A in which the lattice relaxation rate is 100%, that is, the second semiconductor layer 2 does not receive the compressive stress at all, it is assumed that a composition of the first semiconductor layer 1 is $Al_{0.25}Ga_{0.75}N$, and a point indicating this is made to be a point A. At a point B which has the same polarization as the point A and the same a-axis lattice constant as GaN, the composition x2 of Al of the second semiconductor layer 2 is 0.242, and the composition y2 of In of the second semiconductor layer 2 is 0.054. In addition, in order that an a-axis lattice constant of the second semiconductor layer that is the back barrier layer is made equal to the a-axis lattice constant of GaN shown by a broken line of FIG. 3A, or made smaller than the a-axis lattice constant of GaN, it is necessary to satisfy the relation of $y2 \leq 0.224*x2$. In addition, in order that a polarization of the second semiconductor layer 2 that is the back barrier layer is made equal to or smaller than the polarization of the first semiconductor layer 1 that is the buffer layer in the vicinity of the interface with the second semiconductor layer 2, it is necessary to satisfy the relation of $x2-x1 \leq -0.143*y2$.

In the case of FIG. 3B in which the lattice relaxation rate is 50%, that is, the second semiconductor layer 2 receives the compressive stress, it is assumed that a composition of the first semiconductor layer 1 is $Al_{0.25}Ga_{0.75}N$, and a point indicating this is made to be the point A, in the same manner as FIG. 3A. At the point B which has the same polarization as the point A and the same a-axis lattice constant as GaN, the composition x2 of Al of the second semiconductor layer 2 is 0.381, and the composition y2 of In of the second semiconductor layer 2 is 0.141. In addition, in order that an a-axis lattice constant of the second semiconductor layer 2 that is the back barrier layer is made equal to the a-axis lattice constant of GaN shown by a broken line of FIG. 3B or smaller than the a-axis lattice constant of GaN, it is necessary to satisfy the relation of $y2 \leq 0.224*x2+0.056$. In addition, in order that a polarization of the second semiconductor layer 2 that is the back barrier layer is made equal to or smaller than the polarization of the first semiconductor layer 1 that is the buffer layer in the vicinity of the interface with the second semiconductor layer 2, it is necessary to satisfy the relation of $x2-x1 \leq 0.929*y2$.

In the case of FIG. 3C in which the lattice relaxation rate is 30%, that is, the second semiconductor layer 2 greatly receives the compressive stress, it is assumed that a composition of the first semiconductor layer 1 is $Al_{0.25}Ga_{0.75}N$, and a point indicating this is made to be the point A, in the same manner as FIG. 3A. At the point B which has the same polarization as the point A and the same a-axis lattice constant as GaN, the composition x2 of Al of the second semiconductor layer 2 is 0.646, and the composition y2 of In of the second semiconductor layer 2 is 0.275. In addition, in order that an a-axis lattice constant of the second semiconductor layer 2 that is the back barrier layer is made equal to the a-axis lattice constant of GaN shown by a broken line of FIG. 3C or smaller than the a-axis lattice constant of GaN, it is necessary to satisfy the relation of $y2 \leq 0.224*x2+0.131$. In addition, in order that a polarization of the second semiconductor layer 2 that is the back barrier layer is made equal to or smaller than the polarization of the first semiconductor layer 1 that is the buffer layer in the vicinity of the interface with the second semiconductor layer 2, it is necessary to satisfy the relation of $x2-x1 \leq 1.44*y2$.

In addition, the lattice relaxation rate is defined by {(the a-axis lattice constant of the second semiconductor layer 2)−(the a-axis lattice constant of the first semiconductor layer 1)}/{(the a-axis lattice constant of the second semiconductor layer 2 when the compressive stress is not applied)−(the a-axis lattice constant of the first semiconductor layer 1)}.

As described above, the nitride semiconductor device 100 is provided with the second semiconductor layer 2 that is the back barrier layer in the form of the indium gallium aluminum nitride (InAlGaN) layer, and the third semiconductor layer 3 that is the channel layer in the form of the GaN layer, and accordingly, the a-axis lattice constant of InAlGaN of the back barrier layer is approximate to the a-axis lattice constant of GaN of the back barrier layer, and the lattice mismatch rate between the back barrier layer and the channel layer is small. Accordingly, it is possible to uniformly form the GaN layer of the channel layer on the InAlGaN layer of the back barrier layer. In addition, the composition of Al of InAlGaN of the back barrier layer is made large, and thereby the threshold voltage of the nitride semiconductor device 100 can be improved.

In addition, in the present embodiment, the nitride semiconductor device 100 has been a horizontal type FET, but the nitride semiconductor device 100 may be a vertical type FET which is provided with a drain electrode on a substrate to support nitride semiconductor layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride semiconductor device comprising:
   (i) a first semiconductor layer, which satisfies $Al_{x1}Ga_{(1-x1)}N$,
      wherein x1 is greater than 0 and less than or equal to 1;
   (ii) a second semiconductor layer, which satisfies $In_{y2}Al_{x2}Ga_{(1-x2-y2)}N$,
      wherein x2 is greater than 0 and less than 1,
      wherein y2 is greater than 0 and less than 1, and
      wherein x2+y2 is greater than 0 and less than or equal to 1;
   (iii) a third semiconductor layer, which satisfies $Al_{x3}Ga_{(1-x3)}N$,
      wherein x3 is greater than or equal to 0 and less than 1; and
   (iv) a fourth semiconductor layer, which satisfies $In_{y4}Al_{x4}Ga_{(1-x4-y4)}N$,
      wherein x4 is greater than 0 and less than 1,
      wherein y4 is greater than or equal to 0 and less than 1, and
      wherein x4+y4 is greater than 0 and less than or equal to 1,
   wherein the second semiconductor layer is disposed on the first semiconductor layer,
   wherein the third semiconductor layer is disposed on the second semiconductor layer, and
   wherein the fourth semiconductor layer is disposed on the third semiconductor layer.

2. The nitride semiconductor device of claim 1, wherein a lattice constant of the third semiconductor layer is larger than a lattice constant of the second semiconductor layer.

3. The nitride semiconductor device of claim 1, wherein sums of a spontaneous polarization and a piezo polarization in the respective semiconductor layers are smaller in the order of: the first semiconductor layer, the second semiconductor layer, the third semiconductor layer, and the fourth semiconductor layer.

4. The nitride semiconductor device of claim 1, wherein x1, x2 and y2 satisfy $y2 \leq 0.224*x2+0.131$ and $x2-x1 \leq 1.44*y2$.

5. The nitride semiconductor device of claim 1, wherein x1, x2 and y2 satisfy $y2 \leq 0.224*x2$ and $x2-x1 \leq -0.143*y2$.

6. The nitride semiconductor device of claim 1, wherein an atomic ratio of x2 to a total of group III atoms comprised in the second semiconductor layer is not less than 0.1.

7. The nitride semiconductor device of claim 1, wherein an atomic ratio of x2 to a total of group III atoms comprised in the second semiconductor layer is not less than 0.15.

8. The nitride semiconductor device of claim 1, wherein a thickness of the third semiconductor layer is not less than 10 nm and not more than 200 nm.

9. The nitride semiconductor device of claim 1, wherein a thickness of the third semiconductor layer is not less than 20 nm and not more than 100 nm.

10. The nitride semiconductor device of claim 1, further comprising:
   a source electrode disposed on the fourth semiconductor layer;
   a drain electrode disposed on the fourth semiconductor layer; and
   a gate electrode disposed between the source electrode and the drain electrode.

11. The nitride semiconductor device of claim 10, further comprising:
   an insulating layer disposed on the fourth semiconductor layer, and between the source electrode and the drain electrode;
   wherein the drain electrode is disposed on the fourth semiconductor layer, and
   wherein the gate electrode is disposed on the insulating layer.

12. The nitride semiconductor device of claim 11, wherein an atomic ratio of x4 of a portion of the fourth semiconductor layer, wherein the portion is below the gate electrode, to a total of group III atoms comprised in the fourth semiconductor layer is not more than 0.2.

13. The nitride semiconductor device of claim 12, wherein a thickness of a portion of the fourth semiconductor layer, wherein the portion is below the gate electrode, is not less than 0 nm and not more than 5 nm.

14. The nitride semiconductor device of claim 10, wherein an atomic ratio of x4 of the fourth semiconductor layer, other than a portion below the gate electrode, to a total of group III atoms comprised in the fourth semiconductor layer is not less than 0.15.

15. The nitride semiconductor device of claim 14, wherein a thickness of the fourth semiconductor layer, other than the portion below the gate electrode, is not less than 20 nm and not more than 100 nm.

\* \* \* \* \*